(12) United States Patent
Hsu et al.

(10) Patent No.: US 9,904,253 B1
(45) Date of Patent: Feb. 27, 2018

(54) TIME-TO-DIGITAL CONVERTER USING TIME RESIDUE FEEDBACK AND RELATED METHOD

(71) Applicants: Terng-Yin Hsu, Hsinchu (TW);
Chi-Hsu Chen, Hsinchu (TW);
Jung-Chin Lai, Hsinchu (TW);
Hsiang-Ming Yen, Hsinchu (TW)

(72) Inventors: Terng-Yin Hsu, Hsinchu (TW);
Chi-Hsu Chen, Hsinchu (TW);
Jung-Chin Lai, Hsinchu (TW);
Hsiang-Ming Yen, Hsinchu (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 0 days.

(21) Appl. No.: 15/643,465

(22) Filed: Jul. 6, 2017

(30) Foreign Application Priority Data

Jun. 7, 2017 (TW) .............................. 106118865 A (51) Int. Cl.
| | |
|---|---|
| *H03M 1/12* | (2006.01) |
| *G04F 10/00* | (2006.01) |
| *H03L 7/093* | (2006.01) |
| *H03L 7/085* | (2006.01) |
| *H03L 7/099* | (2006.01) |

(52) U.S. Cl.
CPC ............ *G04F 10/005* (2013.01); *H03L 7/085* (2013.01); *H03L 7/093* (2013.01); *H03L 7/0992* (2013.01)

(58) Field of Classification Search
CPC ..... G04F 10/005; H03L 7/0992; H03L 7/093; H03L 7/085
USPC .................................................. 341/155, 166
See application file for complete search history.

(56) References Cited

U.S. PATENT DOCUMENTS

| | | | | |
|---|---|---|---|---|
| 9,240,914 | B2* | 1/2016 | Yao | .................... H04L 27/0014 |
| 9,568,889 | B1* | 2/2017 | Lee | ........................ G04F 10/005 |
| 9,584,177 | B2* | 2/2017 | Pavlovic | .............. H03C 3/0933 |
| 9,639,063 | B2* | 5/2017 | Dutton | .................. G04F 10/005 |
| 2009/0153377 | A1 | 6/2009 | Chang | |
| 2012/0056769 | A1 | 3/2012 | Wang et al. | |

* cited by examiner

*Primary Examiner* — Brian Young (57) ABSTRACT

A method and apparatus for measuring an elapsed time from a starting signal to an ending signal in a time-to-digital converter. Primarily, the invention calculates an amount of complete cycles from the starting signal to a starting edge of a next clock cycle or the next Nth clock cycle (N is a natural number great than one) after the clock cycle corresponding to the ending signal. The amount is multiplied by a cycle time of the coarse clock to obtain a coarse time value. A time residue is calculated from the ending signal to the starting edge. Finally, the time residue is subtracted from the coarse time value to obtain a required time.

14 Claims, 7 Drawing Sheets

TIME-TO-DIGITAL CONVERTER USING TIME RESIDUE FEEDBACK AND RELATED METHOD

BACKGROUND OF THE INVENTION

1. Technical Field

The invention relates to time measurement of time of flight (ToF), particularly to a method and apparatus for time-to-digital conversion using time residue feedback.

2. Related Art

A time-to-digital converter (TDC) is used for measuring a time difference and converting it into a digital format. The TDC's input end accepts two impulses, namely, a starting signal and an ending signal. A time difference between these two impulses is the time difference to be measured. A fundamental principle of TDC is to use a coarse (reference) clock and a counter. A cycle time of the coarse clock is known, and the counter counts an amount of elapsed cycles of the coarse clock during the time difference to be measured so as to know the magnitude of the time difference to be measured.

Figure 1:
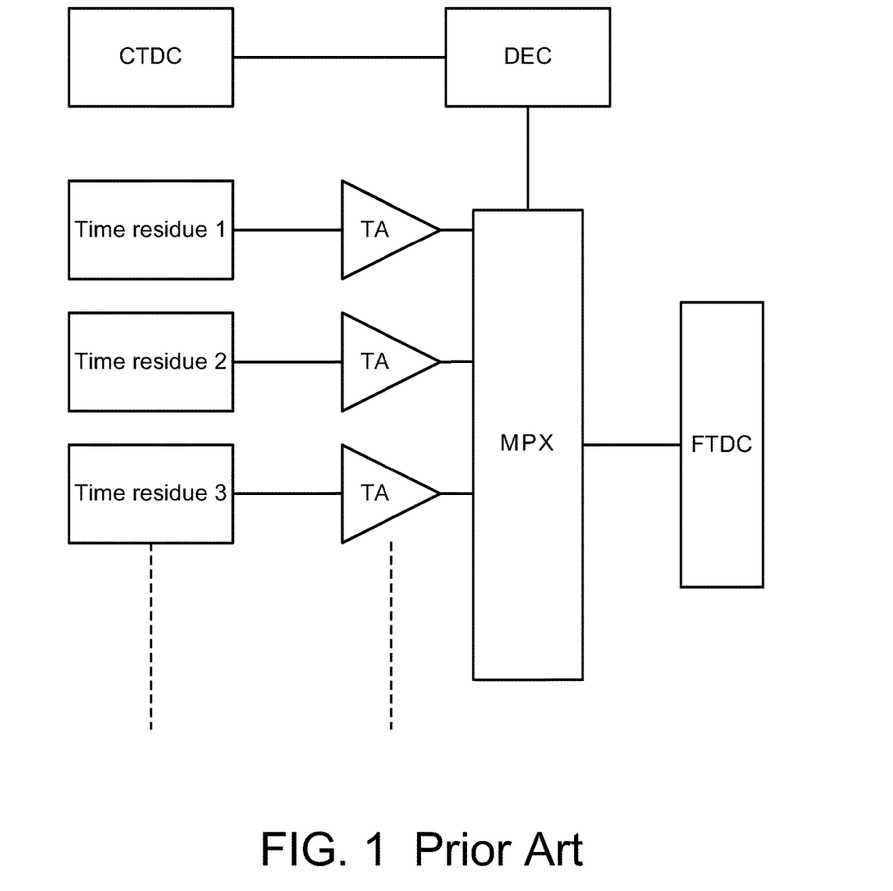
FIG. 1 is a block diagram of a conventional two-stage type time-to-digital converter.

There are many types in framework of TDC. The most common types are two-stage, pipeline and cyclic. A two-stage type TDC, as shown in FIG. 1, uses two TDCs, i.e., a coarse TDC (CTDC) and a fine TDC (FTDC). A time amplifier (TA) is arranged between the two TDCs. The CTDC performs detection of time first. When an ending signal of the CTDC arrives, all D-type flip-flops will be triggered to output all signals at every node on a delay line of the CTDC and convert them into digital codes. And the outputs of the CTDC will generate a selecting signal to control a multiplex (MPX). Inputs of the MPX are separately connected to nodes on the delay line of the CTDC to be selected by the selecting signal. A time residue and the ending signal are sent to the TA to be temporally amplified. Finally, the amplified signals are converted into digital codes by the FTDC. However, resolution of such a two-stage framework is directly proportional to quantity of time residue detectors and TAs. To keep a certain resolution, the hardware structure must be huge. It is very disadvantageous to chip design.

Figure 2:
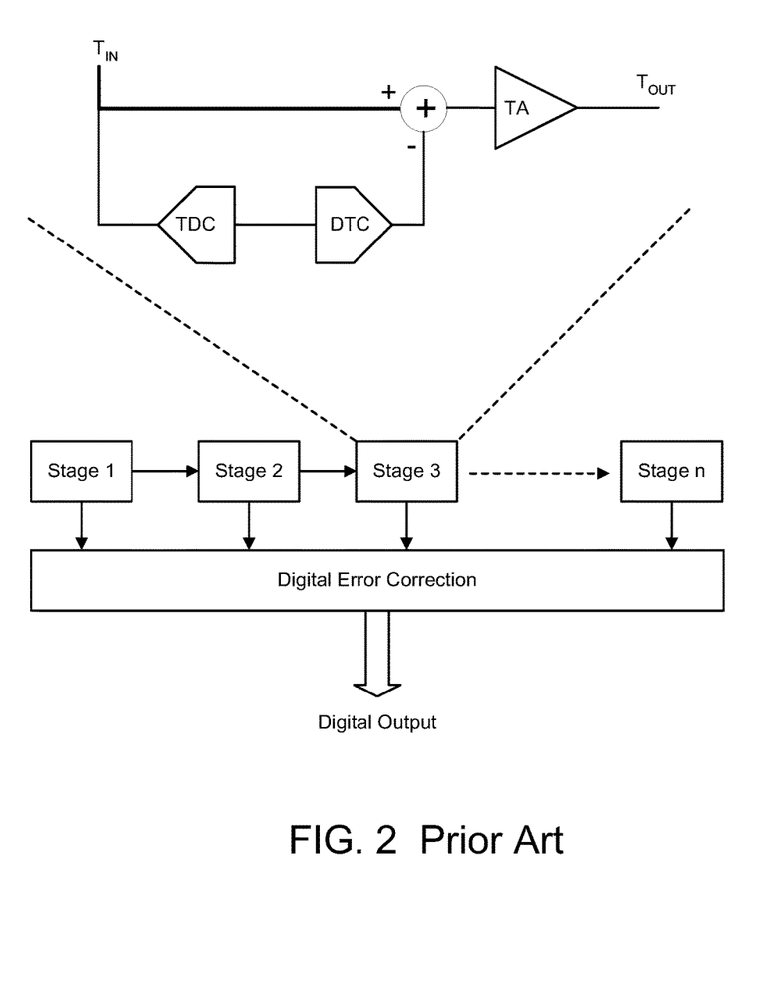
FIG. 2 is a block diagram of a conventional pipeline type time-to-digital converter.

The pipeline type is derived from the two-stage type. The pipeline type divides the conversion into much more stages. As shown in FIG. 2, there are n stages. Composition of every stage is identical to each other, which is composed of a TDC, a digital-to-time converter (DTC) and a TA. When the TDC of the first stage has output digital codes, a time residue is amplified by the TA and then detected by the TDC of the next stage. However, such a pipeline framework must perform conversion and measurement of time residue only after the ending signal. Thus it is not good enough in speed.

Figure 3:
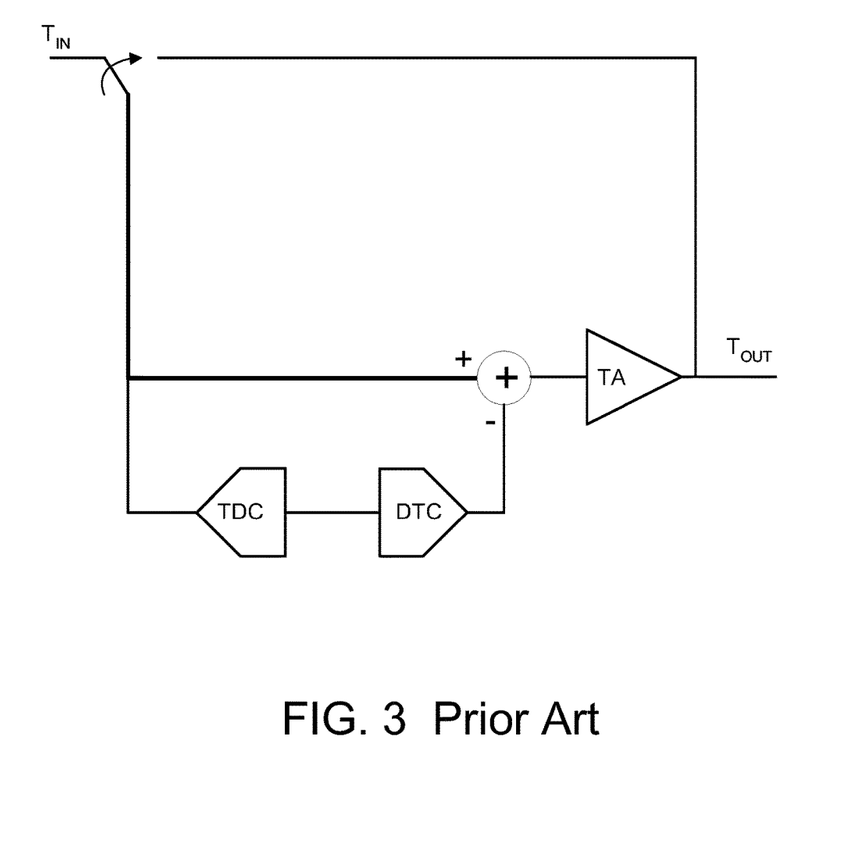
FIG. 3 is a block diagram of a conventional cyclic type time-to-digital converter.

The cyclic type, as shown in FIG. 3, is based upon the pipeline type and adds a feedback path. As a result, the cyclic type still has the same drawback as the pipeline type. That is, its speed is not good enough.

In sum, a common point of the above TDCs is the measurement of the time to be measured. It uses an amount of complete cycles of the coarse clock within the time to be measured as a coarse time value, and the coarse time value is added to a time residue which is a residue of the incomplete cycle corresponding to the ending signal to obtain a required time value. Besides the abovementioned drawbacks, such an adding approach will be inaccurate and irremediable when the ending signal is not correctly detected in the corresponding cycle of the clock because time cannot goes back. Although some new developments may overcome this potential problem by digital correction, it still requires additional algorithms and circuits to judge and calculate. An additional circuit area is still required and a drawback still remains.

SUMMARY OF THE INVENTION

An object of the invention is to provide a method and apparatus of time-to-digital conversion, which can achieve the fastest speed of time-to-digital conversion, high resolution, wide input range and auto error correction under the smallest hardware requirement.

To accomplish the above object, the invention provides a method and apparatus for measuring an elapsed time from a starting signal to an ending signal in a time-to-digital converter. The invention calculates an amount of complete cycles from the starting signal to a starting edge of a next clock cycle or the next Nth clock cycle (N is a natural number great than one) after the clock cycle corresponding to the ending signal. The amount is multiplied by a cycle time of the coarse clock to obtain a coarse time value. A time residue is calculated from the ending signal to the starting edge. Finally, the time residue is subtracted from the coarse time value to obtain a required time.

DETAILED DESCRIPTION OF THE INVENTION

Figure 4:
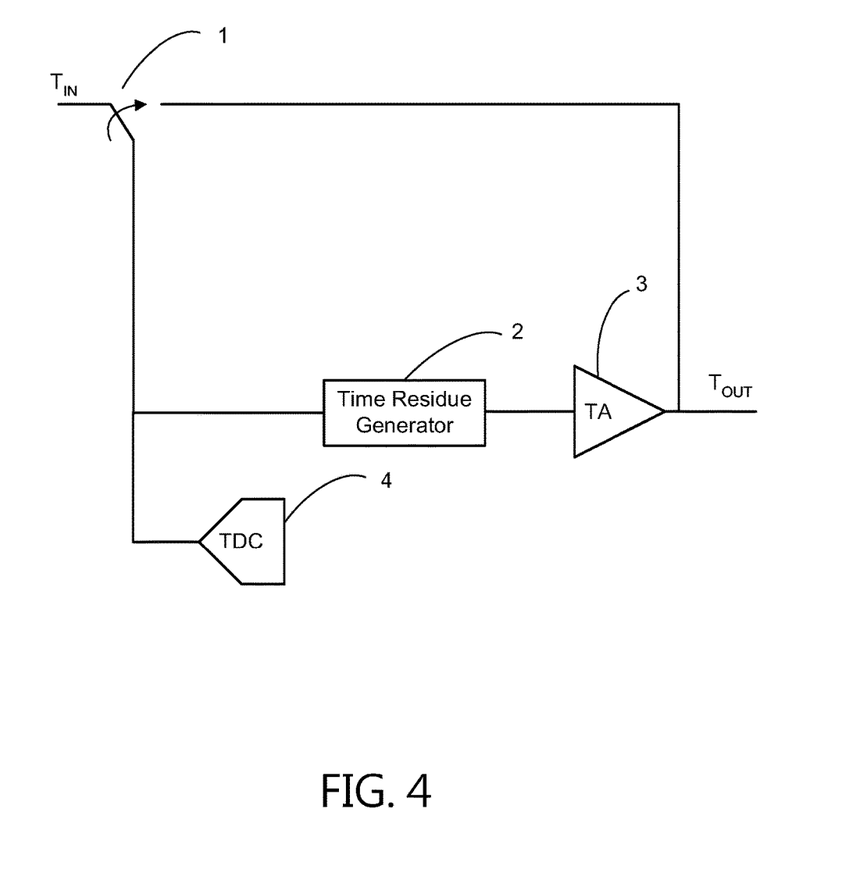
FIG. 4 is a block diagram of framework of the time-to-digital conversion apparatus of the invention.

Please refer to FIG. 4. The time-to digital conversion apparatus of the invention includes a controllable switch 1, a time residue generator 2, a time amplifier (TA) 3 and a time-to-digital converter (TDC) 4. As shown, the controllable switch 1 can be controlled to selectively conduct an input signal with an external signal source to be measured or the feedback path of the output end of the TA 3. The time residue generator 2 is electrically connected with the TA 3 in series to form serial path and the serial path is parallel to the TDC 4.

Figure 5:
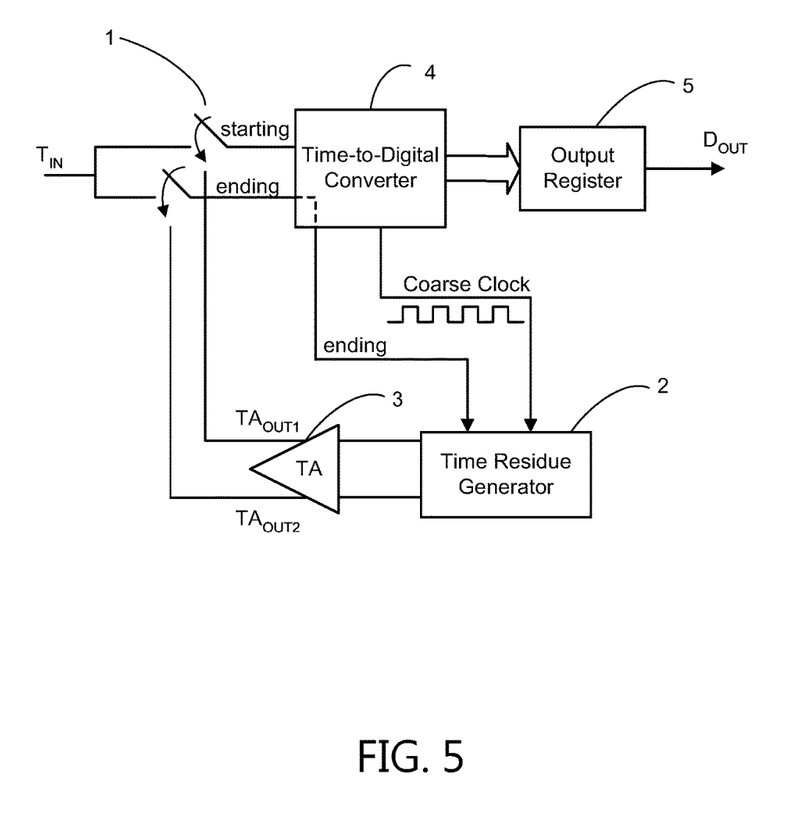
FIG. 5 is a block diagram of a preferred embodiment of the time-to-digital conversion apparatus of the invention.

Please refer to FIG. 5, which is a block diagram of a preferred embodiment of the time-to-digital conversion apparatus of the invention. As shown, the controllable switch 1 has a normally closed end, a normally open end and a common end. The normally closed end is used for connecting a signal source which is capable of sending out a starting signal and an ending signal. The time residue generator 2 has a first input end and a first output end. The first input end is electrically connected to the common end of the controllable switch 1 and a coarse clock. The time amplifier 3 has a second input end and a second output end.

The second input end electrically connects the first output end. The second output end electrically connects the normally open end. The TDC 4 may be a cyclic Vernier type and has a third input end, a third output end and a fourth output end. The third input end electrically connects the common end. The third output end electrically connects the first input end. The fourth output end is used for electrically connecting an output register 5. The TDC outputs the coarse clock.

Figure 6:
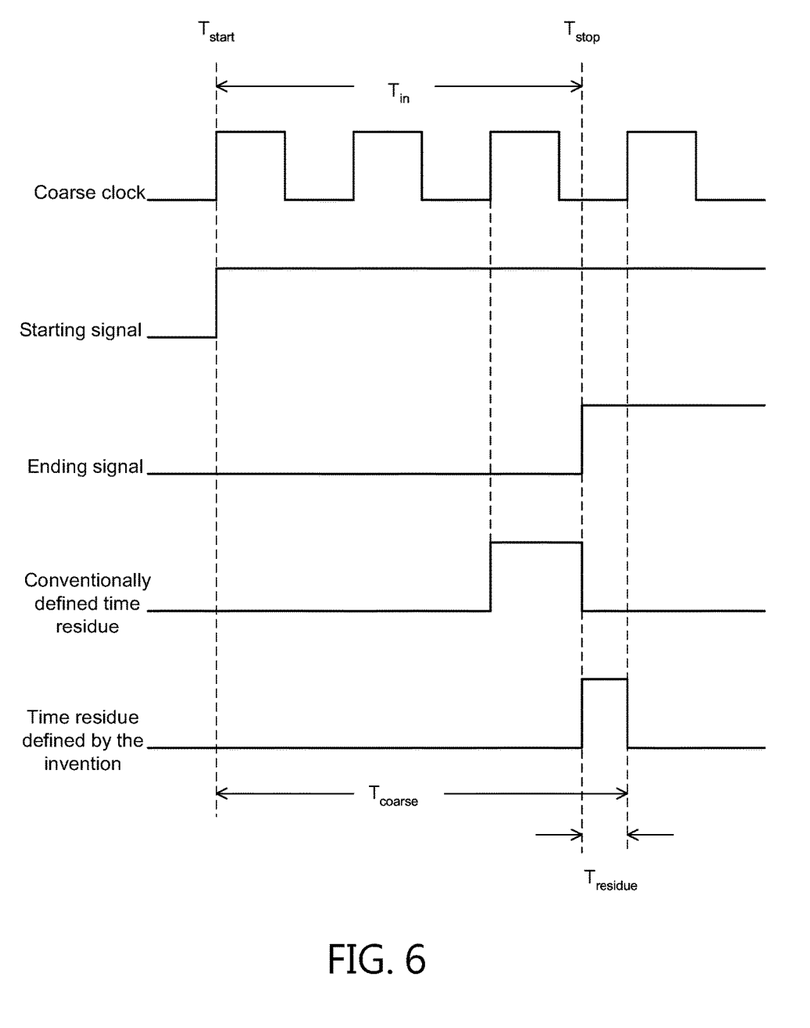
FIG. 6 is a timing diagram of the invention.

Please refer to FIG. 6 together. The input signal time $T_{in}$ is a time difference between the starting signal $T_{start}$ and the ending signal $T_{stop}$. The coarse clock is synchronously activated with the starting signal. The TDC 4 calculates an amount of elapsed complete cycles of the coarse clock between the starting signal and the ending signal. In detailed, the TDC 4 calculates an amount of elapsed complete cycles of the coarse clock from the starting signal to a starting edge of a next cycle or a next Nth cycle (N is a natural number great than one) after the clock cycle corresponding to the ending signal. In a positive edge triggering system, the starting edge is a rising edge. A coarse time value can be obtained by multiplying the amount by a cycle time of the coarse clock $T_{coarse}$ and the coarse time value will be converted into a digital signal. The amount of the elapsed complete cycles includes the incomplete cycle corresponding to the ending signal. For example, the first cycle of the coarse clock is activated by the starting signal, if the ending signal occurs within the eighth cycle, then the eighth cycle is still included in the amount even though it is incomplete.

The time residue generator 2 is activated by triggering of the ending signal for calculating a time residue from the ending signal to the same starting edge of the coarse clock as the abovementioned one. Because both the coarse time value and the time residue are calculated to the same ending cycle or ending time (i.e., the same ending point), a required time can be obtained by subtracting the time residue from the coarse time value. Also, the TDC 4 and the time residue generator 2 are parallel in operation. Their mathematic relationship can be expressed as follows:

$$T_{in}=T_{stop}-T_{start} \quad (1)$$

$$T_{in}=T_{coarse}-T_{residue}=N_c T_c-T_{residue} \quad (2)$$

where $N_c$ is the amount of cycles of the coarse clock in the coarse time, $T_c$ is the cycle time of the coarse clock, and $T_{residue}$ is the time residue. Once the starting edge which should be detected at the next cycle of the coarse clock corresponding to the ending signal (i.e., the starting edge is detected in incorrect following cycle period), this can be remedied at some following cycle. Suppose the ending signal is detected after $N_e$ complete cycles after the cycle it should be detected, formula (2) can be rewritten as:

$$T_{in}=N_c T_c-T_{residue}=(N_c+N_e)T_c-(N_e T_c+T_{residue})$$

In other words, a correct required time can also be obtained by subtracting the delayed time ($N_e T_c$). This is one of features of the invention, no additional circuit or operation is required to make error correction.

Figure 7:
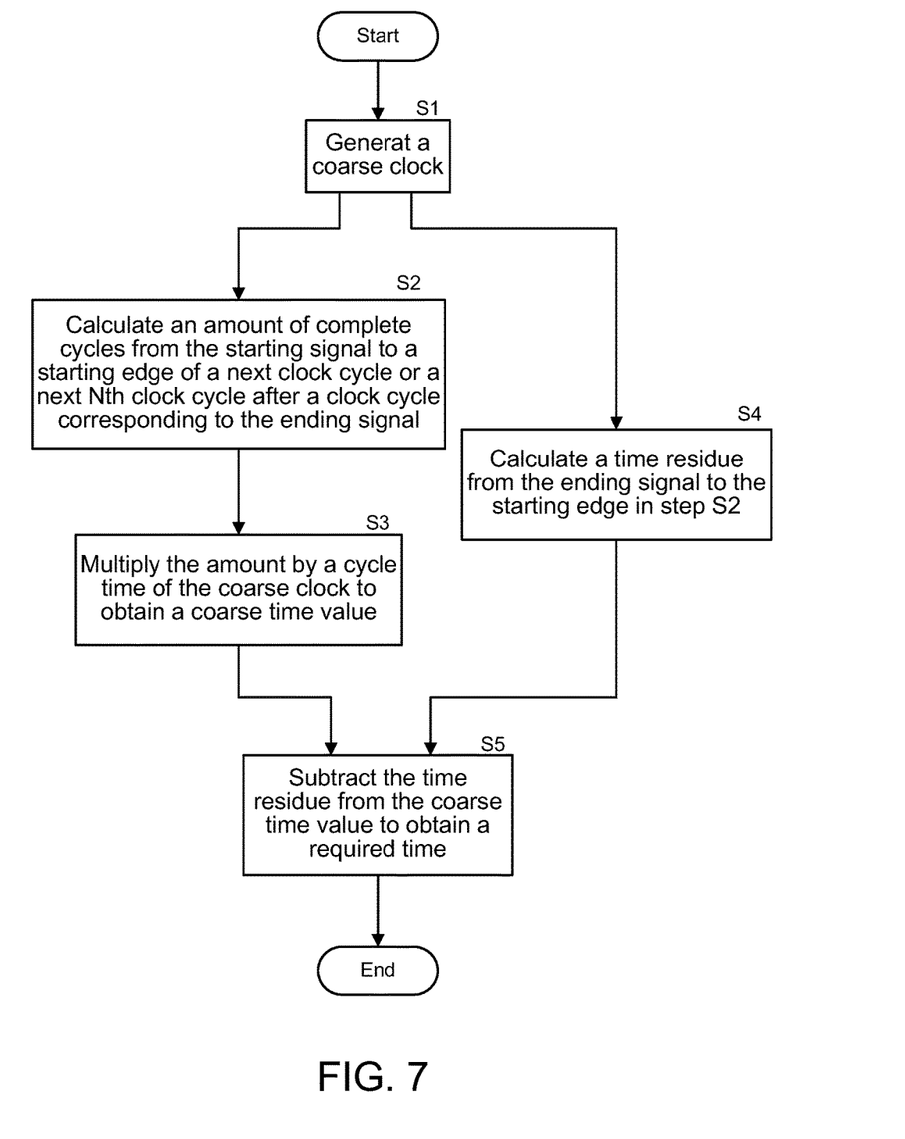
FIG. 7 is a flowchart of the method of the invention.

FIG. 7 shows a flowchart of the method of the invention. The invention provides a method for time-to-digital conversion for measuring an elapsed time from a starting signal to an ending signal and converting to a digital signal. In step S1, a coarse clock is generated. In step S2, calculate an amount of complete cycles from the starting signal to a starting edge of a next clock cycle or a next Nth clock cycle after a clock cycle corresponding to the ending signal. The complete cycles include the incomplete cycle corresponding to the ending signal. In step S3, the amount is multiplied by a cycle time of the coarse clock to obtain a coarse time value. In step S4, a time residue is calculated from the ending signal to the starting edge in step S2. In step S5, the time residue is subtracted from the coarse time value to obtain a required time. Step S2 and step S4 are parallel, end at the same time and switch to a next feedback path when ending (no additional circuit is required to judge the circuit switching).

What is claimed is:

1. A time-to-digital conversion apparatus comprising:
   a controllable switch, having a normally closed end, a normally open end and a common end, wherein the normally closed end is used for connecting a signal source which is capable of sending out a starting signal and an ending signal;
   a time residue generator, having a first input end and a first output end, and the first input end electrically connecting the common end of the controllable switch and a coarse clock;
   a time amplifier, having a second input end and a second output end, the second input end electrically connecting the first output end, and the second output end electrically connecting the normally open end; and
   a time-to-digital converter (TDC), having a third input end, a third output end and a fourth output end, the third input end electrically connecting the common end, the third output end electrically connecting the first input end, the fourth output end being used for electrically connecting an output register, the TDC outputting the coarse clock, calculating an amount of complete cycles from the starting signal to a starting edge of a next cycle after a clock cycle corresponding to the ending signal, and multiplying the amount by a cycle time of the coarse clock to obtain a coarse time value;
   wherein the time residue generator is activated by triggering of the ending signal for calculating a time residue from the ending signal to the starting edge, a required time is obtained by subtracting the time residue from the coarse time value, and the TDC and the time residue generator are parallel in operation.

2. The time-to-digital conversion apparatus of claim 1, wherein the TDC is a cyclic Vernier type.

3. The time-to-digital conversion apparatus of claim 1, wherein the starting edge is a rising edge.

4. A time-to-digital conversion apparatus comprising:
   a controllable switch, having a normally closed end, a normally open end and a common end, wherein the normally closed end is used for connecting a signal source which is capable of sending out a starting signal and an ending signal;
   a time residue generator, having a first input end and a second output end, and the first input end electrically connecting the common end of the controllable switch and a coarse clock;
   a time amplifier, having a second input end and a second output end, the second input end electrically connecting the first output end, and the second output end electrically connecting the normally open end; and
   a time-to-digital converter (TDC), having a third input end, a third output end and a fourth output end, the third input end electrically connecting the common end, the third output end electrically connecting the first input end, the fourth output end being used for electrically connecting an output register, the TDC outputting the coarse clock, calculating an amount of complete cycles from the starting signal to a starting edge of a next Nth cycle (N is a natural number great than one) after a clock cycle corresponding to the ending signal, and multiplying the amount by a cycle time of the coarse clock to obtain a coarse time value;

wherein the time residue generator is activated by triggering of the ending signal for calculating a time residue from the ending signal to the starting edge, a required time is obtained by subtracting the time residue from the coarse time value, and the TDC and the time residue generator are parallel in operation.

5. The time-to-digital conversion apparatus of claim 4, wherein the TDC is a cyclic Vernier type.

6. The time-to-digital conversion apparatus of claim 4, wherein the starting edge is a rising edge.

7. A method for time-to-digital conversion for measuring an elapsed time from a starting signal to an ending signal and converting to a digital signal, comprising:
 a) generating a coarse clock;
 b) calculating an amount of complete cycles from the starting signal to a starting edge of a next clock cycle after a clock cycle corresponding to the ending signal;
 c) multiplying the amount by a cycle time of the coarse clock to obtain a coarse time value;
 d) calculating a time residue from the ending signal to the starting edge in step b); and
 e) subtracting the time residue from the coarse time value to obtain a required time.

8. The method of claim 7, wherein the steps b) and d) are parallel.

9. The method of claim 8, wherein the steps b) and d) end at the same time and switch to a next feedback path when ending.

10. The method of claim 7, wherein the starting edge is a rising edge.

11. A method for time-to-digital conversion for measuring an elapsed time from a starting signal to an ending signal and converting to a digital signal, comprising:
 a) generating a coarse clock;
 b) calculating an amount of complete cycles from the starting signal to a starting edge of a next Nth clock cycle (N is a natural number great than one) after a clock cycle corresponding to the ending signal;
 c) multiplying the amount by a cycle time of the coarse clock to obtain a coarse time value;
 d) calculating a time residue from the ending signal to the starting edge in step b); and
 e) subtracting the time residue from the coarse time value to obtain a required time.

12. The method of claim 11, wherein the steps b) and d) are parallel.

13. The method of claim 12, wherein the steps b) and d) end at the same time and switch to a next feedback path when ending.

14. The method of claim 11, wherein the starting edge is a rising edge.

\* \* \* \* \*